(12) United States Patent
Yang et al.

(10) Patent No.: US 12,620,553 B2
(45) Date of Patent: May 5, 2026

(54) REMOTE SURFACE WAVE PROPAGATION FOR SEMICONDUCTOR CHAMBERS

(71) Applicant: Applied Materials, Inc., Santa Clara, CA (US)

(72) Inventors: Yang Yang, Cupertino, CA (US); Fernando Silveira, Livermore, CA (US); Kartik Ramaswamy, San Jose, CA (US); Yue Guo, Redwood City, CA (US); A N M Wasekul Azad, Cupertino, CA (US); Imad Yousif, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 973 days.

(21) Appl. No.: 17/723,722

(22) Filed: Apr. 19, 2022

(65) Prior Publication Data

US 2023/0335376 A1 Oct. 19, 2023

(51) Int. Cl.
*H01J 37/32* (2006.01)

(52) U.S. Cl.
CPC .. *H01J 37/32082* (2013.01); *H01J 37/32348* (2013.01); *H01J 37/32357* (2013.01); *H01J 37/3244* (2013.01); *H01J 2237/06375* (2013.01)

(58) Field of Classification Search
None
See application file for complete search history.

(56) References Cited

U.S. PATENT DOCUMENTS

| | | | | |
|---|---|---|---|---|
| 4,049,940 | A | * 9/1977 | Moisan | H01J 65/044 |
| | | | | 219/121.36 |
| 4,810,933 | A | * 3/1989 | Moisan | H05H 1/46 |
| | | | | 313/493 |
| 5,082,517 | A | * 1/1992 | Moslehi | H01J 37/32266 |
| | | | | 438/10 |
| 5,389,153 | A | * 2/1995 | Paranjpe | H01J 37/32229 |
| | | | | 315/111.21 |

(Continued)

FOREIGN PATENT DOCUMENTS

| | | |
|---|---|---|
| EP | 3322 263 A1 | 5/2018 |
| JP | 2002033307 A * | 1/2002 |

(Continued)

OTHER PUBLICATIONS

English Machine Translation of Yamazaki (JP2002033307A) retrieved from ESPACENET on Jul. 16, 2025 (Year: 2025).*

(Continued)

*Primary Examiner* — Ram N Kackar
*Assistant Examiner* — Laureen Chan
(74) *Attorney, Agent, or Firm* — Moser Taboada

(57) ABSTRACT
Apparatus provide plasma to a processing volume of a chamber. The Apparatus may comprise a plurality of plasma sources, each with at least a dielectric tube inlet which is at least partially surrounded by a conductive tube which is configured to be connected to RF power to generate plasma and a gas inlet positioned opposite the dielectric tube inlet for a process gas and a dielectric tube directly connected to each of the plurality of plasma sources where the dielectric tube is configured to at least partially contain plasma generated by the plurality of plasma sources and to release radicals generated in the plasma via holes in the dielectric tube.

20 Claims, 9 Drawing Sheets

(56)          References Cited

U.S. PATENT DOCUMENTS

| 6,224,836 | B1 * | 5/2001 | Moisan | H05H 1/46 |
| | | | | 422/186 |
| 6,225,745 | B1 * | 5/2001 | Srivastava | H01J 37/32357 |
| | | | | 438/711 |
| 6,298,806 | B1 * | 10/2001 | Moisan | H05H 1/46 |
| | | | | 118/723 MP |
| 8,039,772 | B2 | 10/2011 | Lee et al. | |
| 2005/0087302 | A1 * | 4/2005 | Mardian | C23C 16/45565 |
| | | | | 156/345.33 |
| 2007/0045244 | A1 | 3/2007 | Lee et al. | |
| 2011/0186226 | A1 * | 8/2011 | Sudou | C23C 16/4558 |
| | | | | 156/345.33 |
| 2013/0001196 | A1 | 1/2013 | Hoffman et al. | |
| 2014/0227881 | A1 * | 8/2014 | Lubomirsky | C23C 16/54 |
| | | | | 156/345.35 |
| 2019/0259583 | A1 | 8/2019 | Baba et al. | |

FOREIGN PATENT DOCUMENTS

| JP | 2003109799 | A | 4/2003 |
| JP | 2005-223079 | A | 8/2005 |
| JP | 2009146837 | A | 7/2009 |
| KR | 10-2010-0129368 | A | 12/2010 |
| WO | WO 2008/018159 | A1 | 2/2008 |
| WO | WO2021247249 | A1 | 12/2021 |

OTHER PUBLICATIONS

M Moisan and Z Zakrzewski, Plasma sources based on the propagation of electromagnetic surface waves, 1991 J. Phys. D: Appl. Phys. 24 1025, (1991) 1025-1048. Printed in the UK, pp. 1024-1048.

Michel Moisan, Claude Beaudry and Philippe Leprince, a Small Microwave Plasma Source for Long col. Production Without Magnetic Field, IEEE Transactions on Plasma Science, vol. PS-3, No. 2, Jun. 1975, Department de Physique, Universite de Montreal 101, Quebec pp. 55-59.

M Moisan et al., The theory and characteristics of an efficient surface wave launcher (surfatron) producing long plasma cols. 1979 J. Phys. D: Appl. Phys. 12, 219, Printed in Great Britain, pp. 219-238.

M Moisan et al., Experimental investigations of the propagation of surface waves along a plasma col. 1982 Plasma Physics 24 1331, Plasma Physics. Vol. 24, No. 11, pp. 1331 to 1400, 1982, Printed in Great Britain, pp. 1331-1400.

International Search Report for PCT/US2023/018784, dated Aug. 8, 2023.

* cited by examiner

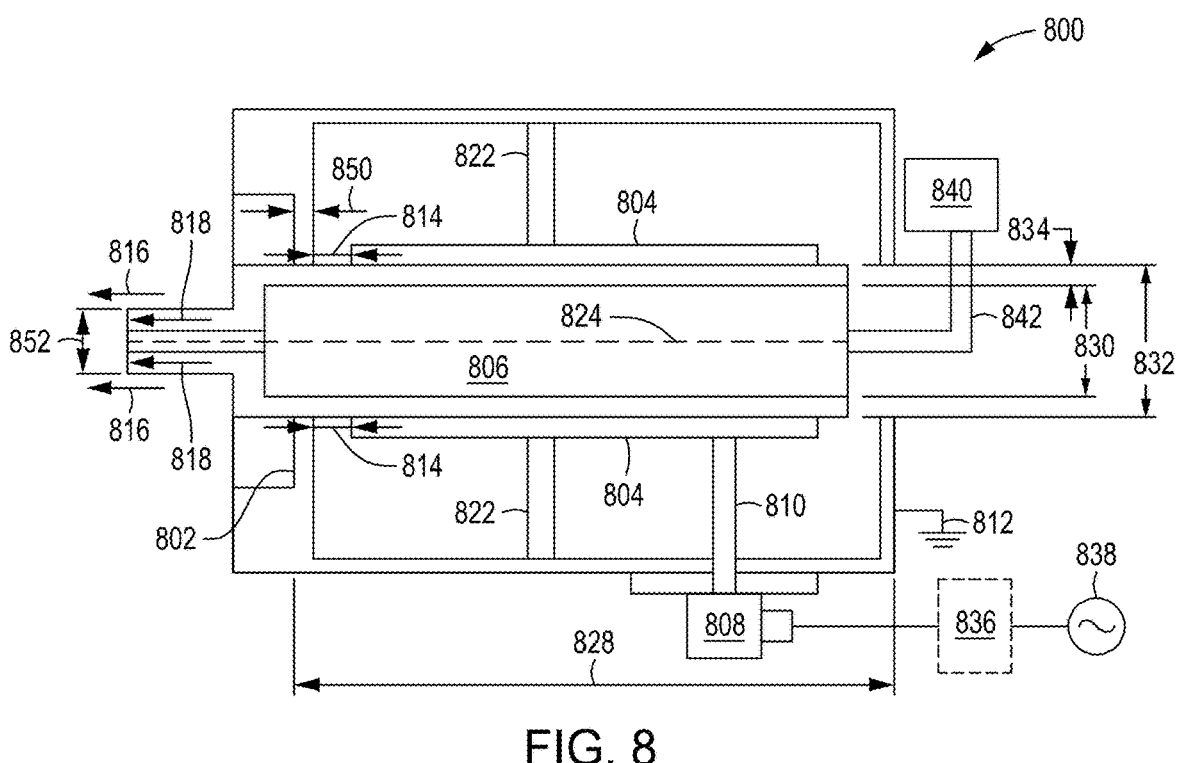
FIG. 8
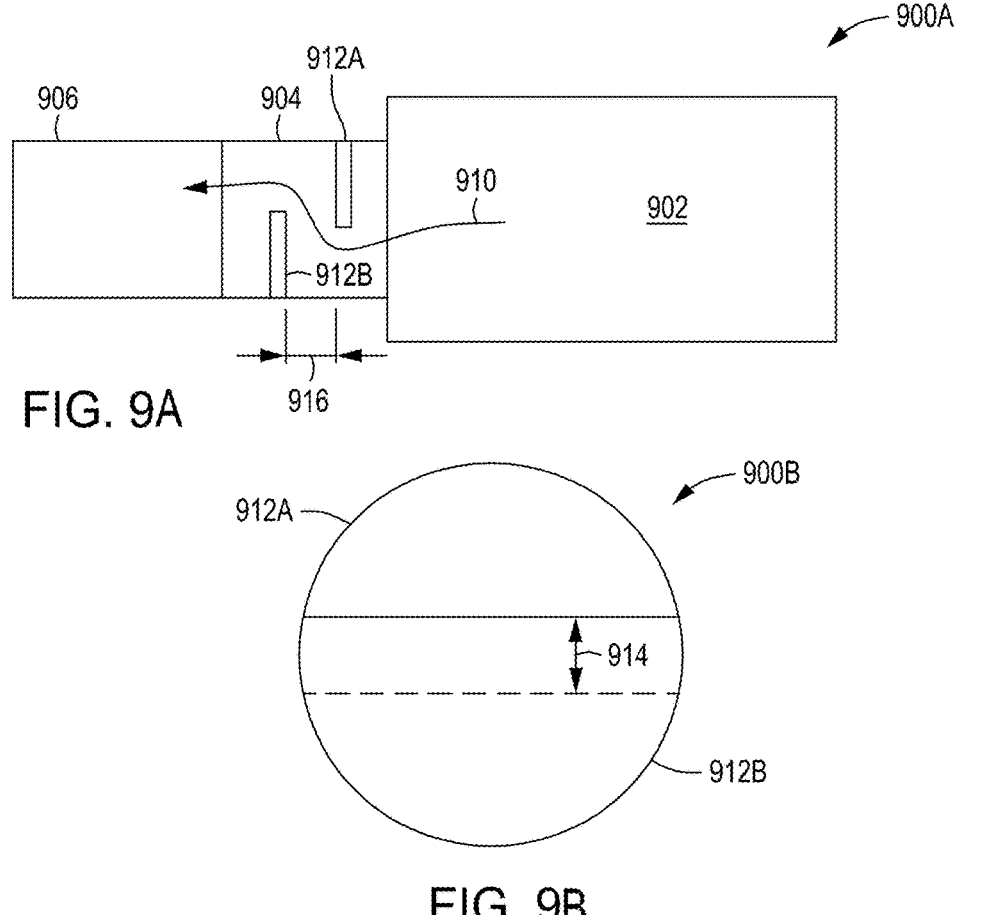
FIG. 9A
FIG. 9B

REMOTE SURFACE WAVE PROPAGATION FOR SEMICONDUCTOR CHAMBERS

FIELD

Embodiments of the present principles generally relate to semiconductor processing of semiconductor substrates.

BACKGROUND

Semiconductor processing may require plasma generation for deposition, oxidation, etching, and other processes. The plasma may be generated directly inside of a processing volume of a chamber or generated remote from the chamber with resulting radicals and the like directed into the chamber. Traditional remote plasma sources require an igniting sequence and then proper conditions to maintain the plasma each time the plasma is needed within the process. The inventors have observed that the process may impact processing yields due to the delays in igniting the plasma to produce required outputs such as radicals. The inventors have also observed that the cycling of the plasma impacts the efficiency of the process and requires increased power to ignite the plasma each time.

Accordingly, the inventors have provided methods and apparatus that provides an efficient and constant remote plasma source that produces higher radical densities.

SUMMARY

Methods and apparatus for a remote plasma source with high efficiency and increased uniformity of process on a substrate are provided herein.

In some embodiments, an apparatus with a plasma source may comprise a chamber with a bottom, a lid, and walls that provide a processing volume above a substrate support and a plurality of plasma sources directly interconnected via a dielectric tube, wherein the dielectric tube at least partially extends into the processing volume and wherein the plurality of plasma sources is configured to generate surface waves in walls of the dielectric tube that support plasma generation within the dielectric tube.

In some embodiments, the apparatus may further include wherein the plurality of plasma sources is positioned within the walls of the chamber and partitioned from the processing volume, wherein one or more of the plurality of plasma sources has one or more gas inlets configured to provide process gas or reactive gas inside of the dielectric tube, wherein at least one of the one or more gas inlets is located at an opposite end of the one or more of the plurality of plasma sources to an end of which the dielectric tube extends from, wherein the dielectric tube has one or more gas inlets configured to provide process gas or reactive gas inside of the dielectric tube, wherein the dielectric tube has a plurality of holes or nozzles directed at the substrate support and wherein the plurality of holes or nozzles is configured to release radicals from within the dielectric tube towards the substrate support, wherein the dielectric tube has an overall circular shape that mimics an outer perimeter of the processing volume, wherein the dielectric tube has concentric circular portions and radial extensions that connect the concentric circular portions, wherein the dielectric tube has an outer diameter of less than approximately 0.5 inches and inner diameter of less than approximately 0.3 inches, wherein the chamber is an etch chamber or a deposition chamber, wherein at least one of the plurality of plasma sources is a surfatron with a length and width of less than three inches, wherein the plurality of plasma sources is positioned externally around the walls of the chamber, wherein the plurality of plasma sources is positioned above and external to the lid of the chamber, and/or wherein each of the plurality of plasma sources is connected to at least one RF power source which provides RF power to a circular conductive tube surrounding a portion of the dielectric tube.

In some embodiments, an apparatus that provides plasma to a chamber may comprise a plurality of plasma sources, each with at least a dielectric tube inlet which is at least partially surrounded by a conductive tube which is configured to be connected to RF power to generate plasma and a gas inlet positioned opposite the dielectric tube inlet and a dielectric tube directly connected to each of the plurality of plasma sources, the dielectric tube configured to at least partially contain plasma generated by the plurality of plasma sources and configured to release radicals generated in the plasma via holes or nozzles in the dielectric tube, wherein the holes or nozzles in the dielectric tube are positioned in a portion of the dielectric tube which is configured to be inserted into the chamber.

In some embodiments, the apparatus may further include wherein the dielectric tube has an overall circular shape that mimics an outer perimeter of an inner volume of the chamber, wherein the dielectric tube has concentric circular portions and radial extensions that connect the concentric circular portions, wherein the dielectric tube has an outer diameter of less than approximately 0.5 inches and inner diameter of less than approximately 0.3 inches, and/or wherein at least one of the plurality of plasma sources is a surfatron with a length and width of less than three inches.

In some embodiments, an apparatus with a plasma source may comprise a chamber with a bottom, a lid, and walls that provide a processing volume above a substrate support; a plurality of plasma sources with inlets and outlets for a dielectric tube to pass through, wherein the plurality of plasma sources is positioned within the walls of the chamber and partitioned from direct exposure to the processing volume, and wherein each of the plurality of plasma sources is a surfatron with a length, width, and height of less than three inches; and the dielectric tube directly connected to each of the plurality of plasma sources, wherein the dielectric tube at least partially extends into the processing volume and wherein the dielectric tube has one or more gas inlets for a gas that forms plasma within the dielectric tube.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

FIG. 8 depicts a cross-sectional view of a surfatron assembly with no pass-through in accordance with some embodiments of the present principles.

FIG. 9A depicts a cross-sectional view and FIG. 9B depicts a cross-sectional end view of a surfatron assembly with a UV filter in accordance with some embodiments of the present principles.

Figure 1:
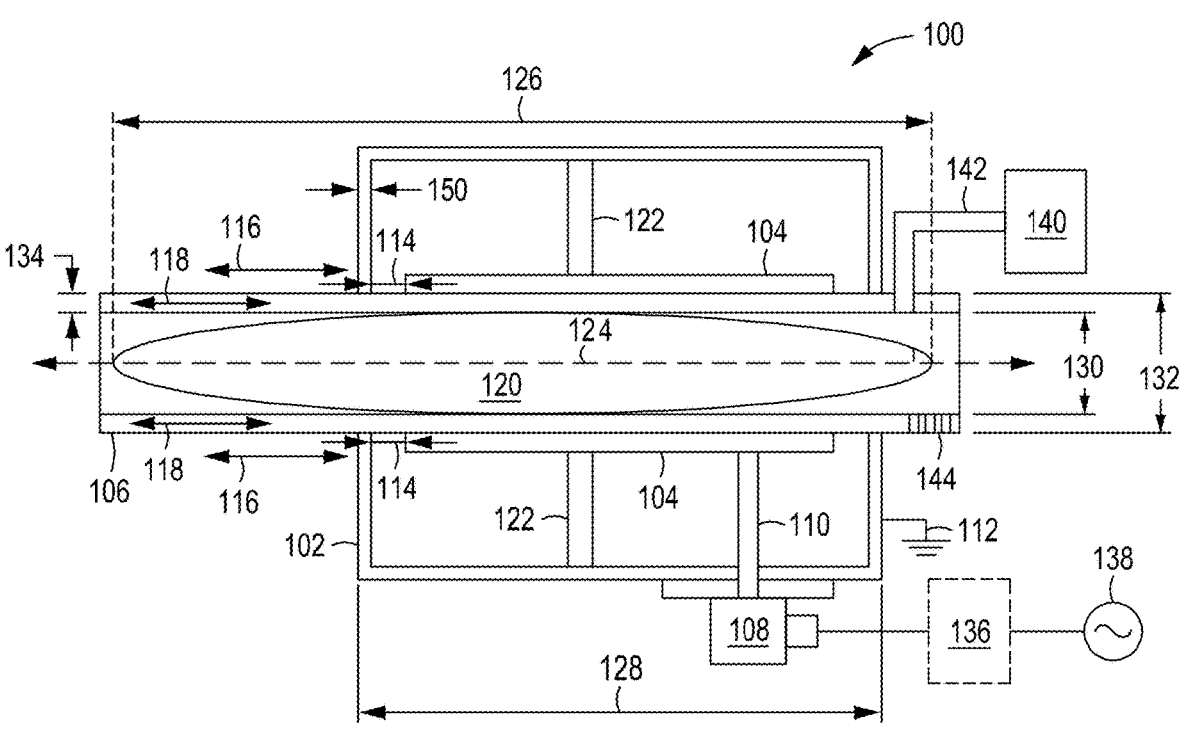
FIG. 1 depicts a cross-sectional view of a surfatron assembly with a pass-through in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a new type of remote plasma source for semiconductor chambers based on surface wave propagation along a dielectric surface which can operate in a wide frequency band from megahertz to gigahertz. The plasma source is a miniaturized remote plasma source with high plasma density and high radical delivery efficiency. The small size of the remote plasma source can be on the order of a few inches, allowing easy placement, especially when retrofitting or providing additional remote plasma sources to existing chamber designs. High plasma density is achievable in the VHF to UHF frequency range where the plasma density can easily reach approximately $10^{11}$ cm$^3$ to $10^{12}$ cm$^3$. In addition, high radical delivery efficiency is obtained where RF Power is deposited along the dielectric surface into the plasma so radicals can be generated close to targeted surfaces when the dielectric part is extended into the process chamber.

Remote plasma sources have been traditionally used in semiconductor industry for dry removal of photoresist or chamber cleaning for chemical vapor deposition (CVD) and/or plasma vapor deposition (PVD) processes, etc. The remote plasma dissociates feedstock gases and then radicals are flowed into the process chamber for further reactions. Depending on the process requirement, the charged particles or ultraviolet (UV) light from the plasma source can be blocked to prevent UV damage to chamber or wafer being processed. Traditional remote plasma sources, transformer coupled toroidal sources, microwave sources, inductively coupled or capacitively coupled sources have all been produced and are commercially available but do not provide the efficiency and uniformity control afforded by the methods and apparatus of the present principles.

The miniaturized surfatrons of the present principles may be utilized in conjunction with dielectric tubes to extend the plasma into a process chamber while maintaining the plasma within the dielectric tubes. The inventors have found that the dielectric tube acts as the vacuum boundary inside the processing volume of the process chamber, allowing plasma reactions and radical delivery at very low pressures—down to at least 0.01 mTorr. Maintaining plasma and radical delivery at such low pressures was unexpected by the inventors. The inventors found that at low pressure, the electrons flow parallel to the walls of the dielectric tube in a large volume with dramatically reduced collisions (as opposed to electrons traveling perpendicular to the walls of the dielectric tube). The inventors believe that since the collision distance is increased, the plasma can be maintained at much lower pressure levels than with conventional plasma sources which produce perpendicular electric fields. The inventors also believe that the surfatron of the present principles acts as a coaxial line where the center rod is the plasma, and the ground is the surfatron housing. The close coupling between the plasma and the ground with an uninterrupted wave propagating therebetween allows the low-pressure plasma to be maintained. The resulting high efficiency of the surfatron of the present principles may be 5 to 10 times greater than conventional remote plasma sources.

The inventors have also found the surfatron affords additional tuning knobs for substrate processing. Increasing the power to the surfatron increases deposition rates. Increasing the frequency applied to the surfatron increases the efficiency of the surfatron in delivering radicals to the process chamber. The inventors discovered that frequency also plays a role in maintaining plasma at various pressures. Certain frequency values allowed pressure adjustments to any pressure level while frequencies above or below that frequency would not allow such a wide range of pressure levels to maintain the plasma. Different dielectric tube configurations can also be used with the surfatrons to deliver radicals to different areas of a substrate (e.g., center region versus edge region, etc.) and/or at different rates. The surfatrons can also be configured to operate, for example, in a first pair with a first dielectric tube and a second pair with a second dielectric tube. Different generators or RF power sources can be used to power each pair of surfatrons. Power and frequency can then be used as tuning knobs to alter radical delivery and/or deposition rates at different areas of a substrate.

The surfatrons operate in an 'always on' configuration as opposed to traditional remote plasma sources and do not require specialized ignition sequences and pressures like traditional remote plasma sources. When plasma is needed within the process chamber, power is increased, and the column of plasma is extended further through the dielectric tube as needed for radical delivery. Multiple surfatrons can be used on the same dielectric tube to even the plasma intensity throughout the dielectric tube (intensity is reduced as the length of the plasma column increases). Different reactive gases such as oxygen and/or chlorine gases and the like along with process gases can be injected directly into a dielectric tube inside of the surfatron and/or directly into a dielectric tube external to the surfatron depending on the configuration. The dielectric tubes may be configured with nozzles to further distribute and direct the radicals towards a substrate and the like during processing. The surfatron and dielectric tube configurations of the present principles provide great process flexibility, high efficiency, and the ability to be retrofitted onto and/or into existing chambers.

FIG. 1 is a cross-section of a surfatron assembly 100 with a pass-through dielectric tube 106 that may be used in some embodiments. Other embodiments of the surfatron assembly discussed later may use a non-pass-through dielectric tube configuration. Operationally, the pass-through configuration and the non-pass-through configuration generate plasma in a similar fashion with plasma only generated out of a front of a non-pass-through configuration. The operation details discussed presently are for the pass-through configuration with plasma provided out of both ends of the surfatron assembly. The surfatron assembly 100 is a coaxial structure with a gap 114 of approximately 0.08 inches at one end of a conductive cylinder 104 encasing a portion of the dielectric tube 106. The gap 114 serves as a launching gap of a surface wave 118 in the dielectric tube 106. In the surfatron assembly 100, a traveling electric field 116 is established between the conductive cylinder 104 which is RF hot (connected to RF power via RF electrode 110 and RF connector 108) to a ground shield (e.g., a front wall 102 of the surfatron assembly 100 which is connected to RF ground 112). The ground shield at the gap 114 is kept thin to prevent choking of the surface wave 118 initiated by the gap 114. In some embodiments, the thickness 150 of the ground shield at the gap 114 is less than approximately 0.04 inches. In some embodiments, the thickness 150 of the ground shield at the gap 114 is approximately 0.02 inches. The thin ground shield may form only a portion of the front wall 102 in some embodiments or be embedded in a dielectric material of the front wall 102. Dielectric spacers 122 may be used to offset the conductive cylinder 104 and from the walls of the surfatron assembly 100. The dielectric spacers 122 may be formed from materials such as polytetrafluoroethylene (PTFE) and the like.

At the launching gap, the direction of the traveling electric field 116 becomes horizontal (from the end of the conductive cylinder 104 to the vertical ground wall or front wall 102), parallel to the axial direction 124 of the dielectric tube 106, thereby launching a transverse magnetic field surface wave (direction of the traveling electric field 116 is parallel to the wave propagation direction (surface wave 118)). The direction of the magnetic field is azimuthal while the direction of the electric field is axial or radial. The surface wave 118 propagates along the dielectric tube 106 and generates plasma 120 along the way. The length 126 of the column of plasma 120 inside the dielectric tube 106 is a function of power and can be extended to any length based on the amount of input power. In some embodiments, at least one gas supply 140 may be connected to the dielectric tube 106, internally (not shown) or externally (shown) of the surfatron assembly 100 via at least one gas supply inlet 142. The gas provided by the gas supply 140 is used in some processes which employ reactive gases to provide radical delivery in a processing volume of a process chamber for substrate processing. The radical delivery is provided by holes 144 typically in the bottom or the sides of the dielectric tube 106. As used herein "holes" are construed as pertaining to actual apertures and also to nozzles that contain apertures and may be used to direct the release of gases/radicals from a dielectric tube for any or all of the configurations of the present principles.

The inventors have found that the surfatron assembly 100 can operate in a frequency range of megahertz to gigahertz, from approximately 0.01 mTorr to atmospheric pressure. The low operating pressure capability of the surfatron assembly 100 was an unexpected advantage discovered by the inventors. The overall length 128 of the surfatron assembly 100 can be made less than 3 inches. In some embodiments, the length, height, and width are all less than 3 inches. In some embodiments, the overall length 128 can be less than approximately 2.5 inches with a height and width of less than 2 inches. In some embodiments, the inner diameter 130 of the dielectric tube 106 can be from approximately 0.2 inches to approximately 20 inches. In some embodiments, the outer diameter 132 of the dielectric tube 106 can be from approximately 0.25 inches to approximately 24 inches. In some embodiments, a thickness 134 of the dielectric tube 106 may be from approximately 0.0625 inches to approximately 4 inches. In some embodiments, the thickness 134 of the dielectric tube 106 may be from approximately 0.0625 inches to approximately 0.125 inches. The thickness 134 may be adjusted to maintain integrity of the dielectric tube walls based on the amount of vacuum used during a substrate process. The walls of the dielectric tube 106 provide the vacuum boundary between the processing volume and the generated plasma inside of the dielectric tube 106. Process chambers with higher process vacuum may use a dielectric tube 106 with thicker walls. In some instances, an optional RF match 136 may be used between the surfatron assembly 100 and an RF generator 138. Depending on the size and/or design of the coaxial structure and the operational pressure regime, the optional RF match 136 may not be used, only the frequency tuning capability of the RF generator 138 may be used.

Figure 2:
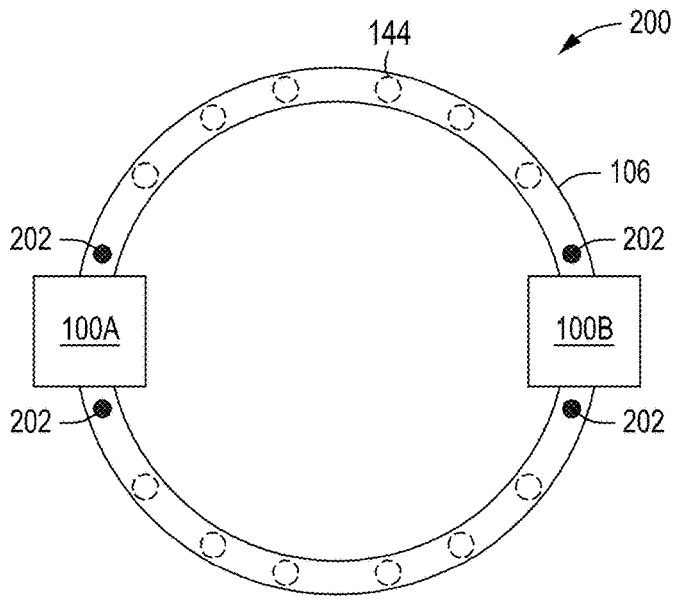
FIG. 2 depicts a top-down view of a plasma source apparatus with a plurality of surfatron assemblies in accordance with some embodiments of the present principles.
Figure 3:
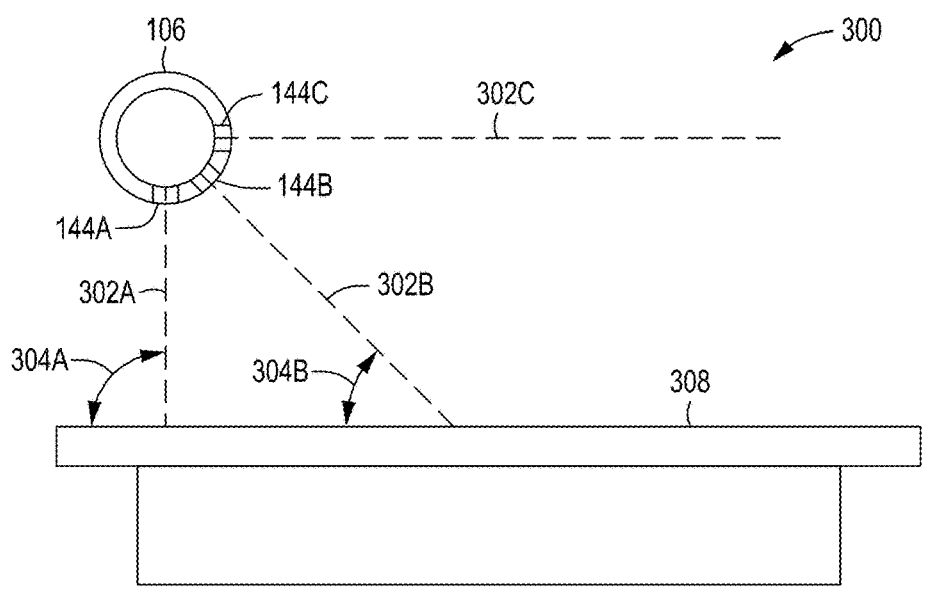
FIG. 3 depicts a cross-sectional view of hole/nozzle orientation of a dielectric tube relative to a substrate support surface in accordance with some embodiments of the present principles.

FIG. 2 is a top-down view of a plasma source apparatus 200 that includes a first surfatron assembly 100A and a second surfatron assembly 100B which are directly connected together via the dielectric tube 106. In some embodiments, a plurality of plasma sources or surfatron assemblies totaling more than two surfatron assemblies may be used. In some embodiments, the outer diameter of the dielectric tube 106 may be from approximately 0.4 inches to approximately 6.0 inches. In some embodiments, gas injection ports 202 may be positioned near the first surfatron assembly 100A and the second surfatron assembly 100B to provide process gases and/or reactive gases for the plasma. The holes 144 in the dielectric tube 106 can be of any configuration and number. The holes 144 may be offset, both small and large diameter holes, holes on the sides of the dielectric tube 106, and/or holes on the bottom and sides of the dielectric tube 106, and the like. In some embodiments, the diameter of the holes 144 may range from approximately 0.04 inches to approximately 0.4 inches. In some embodiments, as depicted in a view 300 of FIG. 3, process uniformity may be improved by adjusting the orientation of the holes 144A, 144B, 144C relative to a surface 308 of substrate support 306 (e.g., vertical or bottom hole 144A with a 90 degree angle 304A relative to the surface 308 and a vertical or bottom hole center axis 302A, angled hole 144B with a 45 degree 304B or other angle to the surface 308 of the substrate support 306 relative to the surface 308 and an angled hole center axis 302B, and/or horizontal or side hole 144C with a 180 degree angle to the surface 308 of the substrate support 306 relative to the surface 308 and a side hole center axis 302C). The holes 144 allow radical delivery to the substrate processing in a process chamber. An advantage of the present principles is that the hole size and placement can be adjusted based on the chamber and/or the particular process being used to increase uniformity and the like. In some embodiments, adjustable or directional nozzles may be used at the locations of the holes 144A-144C to further tune the flow direction towards the surface 308.

Figure 4:
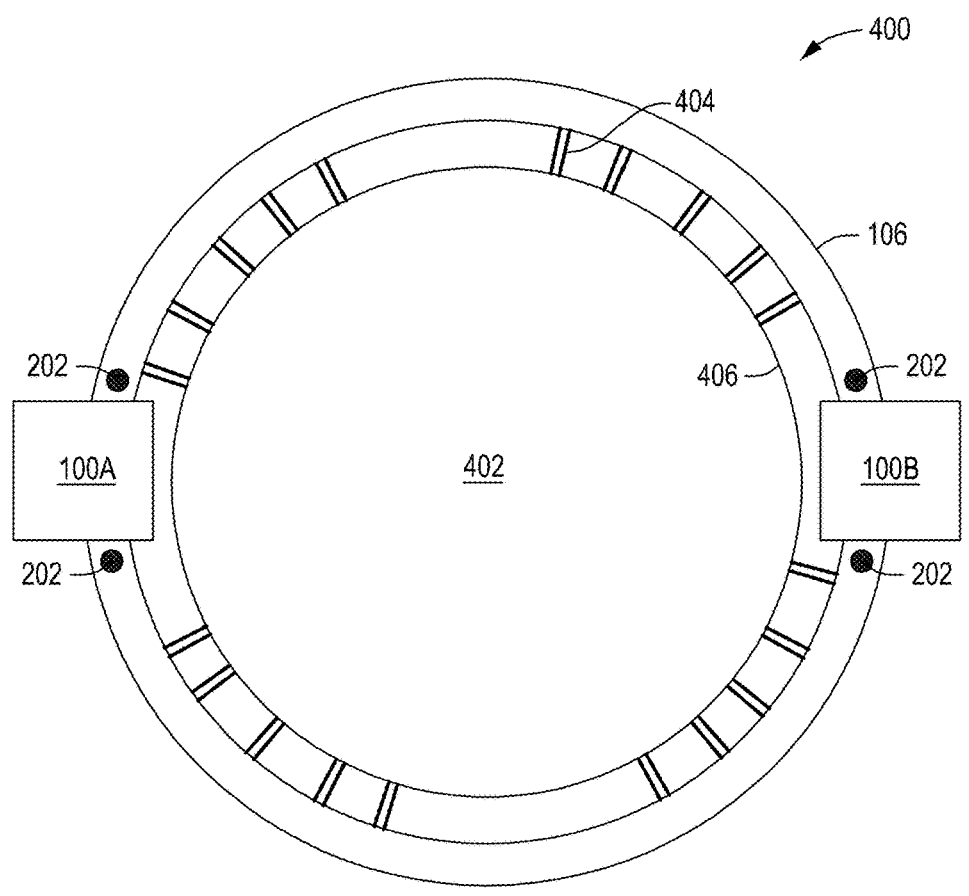
FIG. 4 depicts a top-down view of nozzle extensions for an externally mounted dielectric tube in accordance with some embodiments of the present principles.

The use of a plurality of plasma sources allows for greater control of the radical delivery process. The plasma power to each plasma source can be adjusted in unison or independently of each other, allowing an additional tuning knob for processes. In addition, adjusting the plasma power allows adjustability of the plasma columns formed within the dielectric tube 106. The circular shape of the dielectric tube 106 allows the dielectric tube 106 to conform to the shape of a process chamber, either the shape of the interior processing volume or the shape of the exterior of the process chamber. When the dielectric tube 106 is used on the exterior of the process chamber, nozzle extensions 404 from the holes 144 of the dielectric tube 106 extending through the outer walls 406 of the process chamber 402 may be used as depicted in a top-down view 400 of FIG. 4.

Figures 5A, 5B:
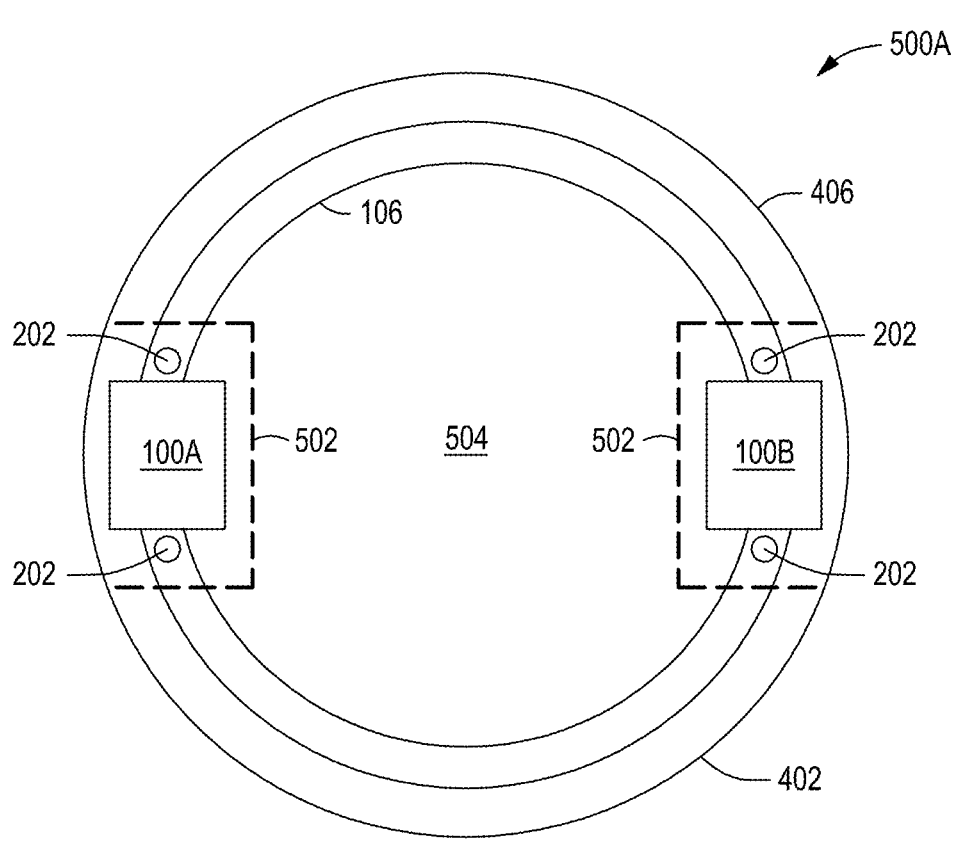
FIG. 5A depicts a top-down view and FIG. 5B depicts a cross-section view of an internally mounted dielectric tube in accordance with some embodiments of the present principles.
Figure 6:
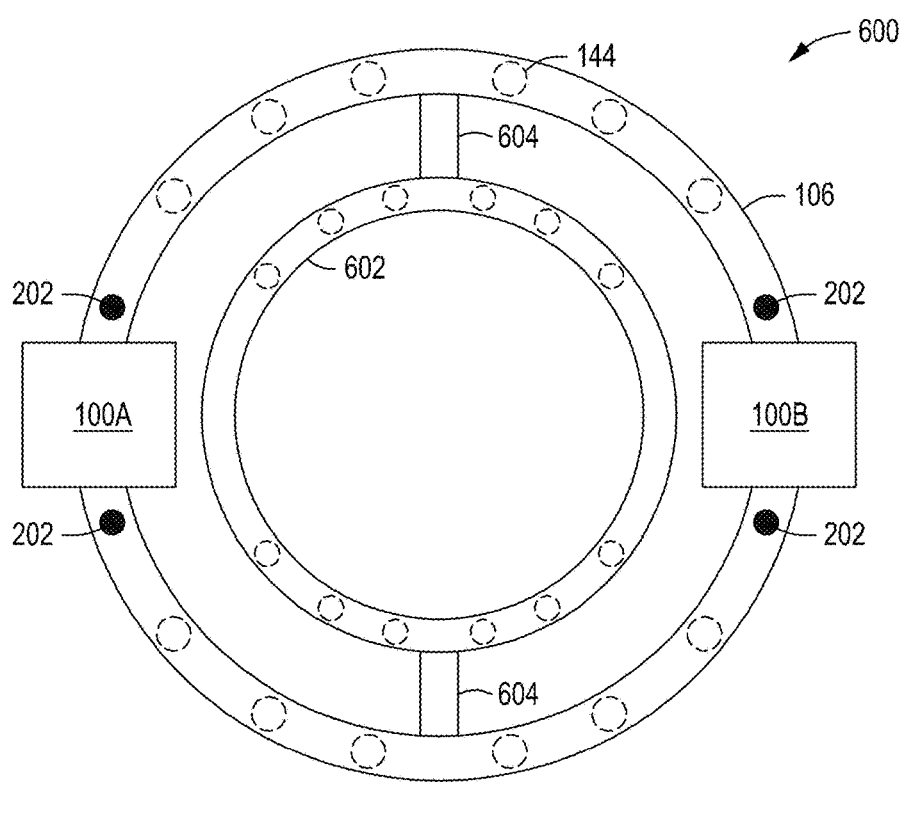
FIG. 6 depicts a top-down view of an additional circular section of a dielectric tube in accordance with some embodiments of the present principles.

In a top-down view 500A of FIG. 5, in some embodiments, the dielectric tube 106 is placed within the outer walls 406 of the process chamber 402 in the processing volume 504. In some embodiments, optional partitions 502 may be used to isolate the first surfatron assembly 100A and the second surfatron assembly 100B from the processing volume such that the assemblies are shielded from the processing environment and remain in atmospheric conditions rather in a vacuum environment. In a cross-section view 500B of FIG. 5, the optional partitions 502, assemblies, and dielectric tube 106 are shown in relation to the substrate support 306 in the process chamber 402. In some embodiments, the circular shape of the dielectric tube 106 may be adjusted to conform with a substrate diameter that is undergoing processing. The circular shape of the dielectric tube 106 may also be smaller in diameter than the substrate diameter. In the top-down view 600 of FIG. 6, an additional circular section 602 of dielectric tube is connected to the dielectric tube 106 via radial sections 604 in some embodiments. One skilled in the art can appreciate that other configurations of concentric circles and radial sections can be used to increase uniformity by adjusting radical delivery in areas of a substrate that may need more or less radical density.

Figure 7:
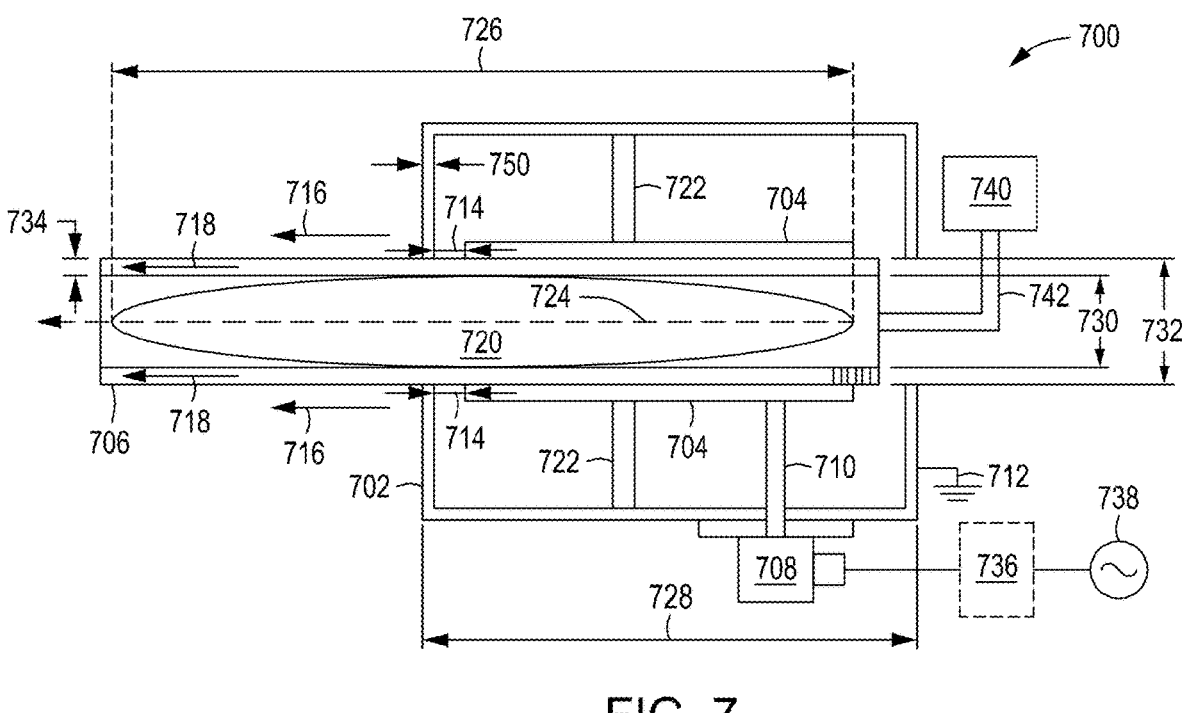
FIG. 7 depicts a cross-sectional view of a surfatron assembly with no pass-through in accordance with some embodiments of the present principles.

In FIG. 7 is a cross-section of a surfatron assembly 700 with a non-pass-through dielectric tube 706 that may be used in some embodiments. Operationally, the non-pass-through configuration and the pass-through configuration generate plasma in a similar fashion with plasma only generated from the front of the non-pass-through configuration. The surfatron assembly 700 is a coaxial structure with a gap 714 of approximately 0.08 inches at one end of a conductive cylinder 704 encasing a portion of the dielectric tube 706. The gap 714 serves as a launching gap of a surface wave 718 in the dielectric tube 706. In the surfatron assembly 700, a traveling electric field 716 is established between the conductive cylinder 704 which is RF hot (connected to RF power via RF electrode 710 and RF connector 708) to a ground shield (e.g., a front wall 702 of the surfatron assembly 700 which is connected to RF ground 712). The ground shield at the gap 714 is kept thin to prevent choking of the surface wave 718 initiated by the gap 714. In some embodiments, the thickness 750 of the ground shield at the gap 714 is less than approximately 0.04 inches. In some embodiments, the thickness 750 of the ground shield at the gap 714 is approximately 0.02 inches. The thin ground shield may form only a portion of the front wall 702 in some embodiments or be embedded in a dielectric material of the front wall 702. Dielectric spacers 722 may be used to offset the conductive cylinder 704 and from the walls of the surfatron assembly 700. The dielectric spacers 722 may be formed from materials such as polytetrafluoroethylene (PTFE) and the like.

At the launching gap, the direction of the traveling electric field 716 becomes horizontal (from the end of the conductive cylinder 704 to the vertical ground wall or front wall 702), parallel to the axial direction 724 of the dielectric tube 706, thereby launching a transverse magnetic field surface wave (direction of the traveling electric field 716 is parallel to the wave propagation direction (surface wave 718)). The direction of the magnetic field is azimuthal while the direction of the electric field is axial or radial. The surface wave 718 propagates along the dielectric tube 706 and generates plasma 720 along the way. The length 726 of the column of plasma 720 inside the dielectric tube 706 is a function of power and can be extended to any length based on the amount of input power. In some embodiments, at least one gas supply 740 may be connected to the dielectric tube 706, internally of the surfatron assembly 700 via at least one gas supply inlet 742. The gas provided by the gas supply 740 is used in some processes to provide process and/or reactive gases to for radical delivery in a processing volume of a process chamber for substrate processing. The radical delivery is provided by holes typically in the bottom or the sides of the dielectric tube 706 (with similar parameters and orientations as holes 144 discussed above).

The inventors have found that the surfatron assembly 700 can operate in a frequency range of megahertz to gigahertz, from approximately 0.01 mTorr to atmospheric pressure. The low operating pressure capability of the surfatron assembly 700 was an unexpected advantage discovered by the inventors. The overall length 728 of the surfatron assembly 700 can be made less than 3 inches. In some embodiments, the length, height, and width are all less than 3 inches. In some embodiments, the overall length 728 can be less than approximately 2.5 inches with a height and width of less than 2 inches. In some embodiments, the inner diameter 730 of the dielectric tube 706 can be from approximately 0.2 inches to approximately 20 inches. In some embodiments, the outer diameter 732 of the dielectric tube 706 can be from approximately 0.25 inches to approximately 24 inches. In some embodiments, a thickness 734 of the dielectric tube 706 may be from approximately 0.0625 inches to approximately 4 inches. In some embodiments, the thickness 734 of the dielectric tube 706 may be from approximately 0.0625 inches to approximately 0.125 inches. The thickness 734 may be adjusted to maintain integrity of the dielectric tube walls based on the amount of vacuum used during a substrate process. The walls of the dielectric tube 706 provide the vacuum boundary between the processing volume and the generated plasma inside of the dielectric tube 706. Process chambers with higher process vacuum may use a dielectric tube 706 with thicker walls. In some instances, an optional RF match 736 may be used between the surfatron assembly 700 and an RF generator 738. Depending on the size and/or design of the coaxial structure and the operational pressure regime, the optional RF match 736 may not be used, only the frequency tuning capability of the RF generator 738 may be used.

In FIG. 8 is a cross-section of a surfatron assembly 800 with a non-pass-through dielectric tube 806 that may be used in some embodiments. The surfatron assembly 800 is a coaxial structure with a gap 814 of approximately 0.08 inches at one end of a conductive cylinder 804 encasing a portion of a dielectric tube 806. The gap 814 serves as a launching gap of a surface wave 818 in the dielectric tube 806. In the surfatron assembly 800, a traveling electric field 816 is established between the conductive cylinder 804 which is RF hot (connected to RF power via RF electrode 810 and RF connector 808) to a ground shield (e.g., a front wall 802 of the surfatron assembly 800 which is connected to RF ground 812). The ground shield at the gap 814 is kept thin to prevent choking of the surface wave 818 initiated by the gap 814. In some embodiments, the thickness 850 of the ground shield at the gap 814 is less than approximately 0.04 inches. In some embodiments, the thickness 850 of the ground shield at the gap 814 is approximately 0.02 inches. The thin ground shield may form only a portion of the front wall 802 in some embodiments and/or be embedded in a dielectric material of the front wall 802 (as shown). Dielectric spacers 822 may be used to offset the conductive cylinder 804 and from the walls of the surfatron assembly 800. The dielectric spacers 822 may be formed from materials such as polytetrafluoroethylene (PTFE) and the like.

At the launching gap, the direction of the traveling electric field 816 becomes horizontal (from the end of the conductive cylinder 804 to the vertical ground wall or front wall 802), parallel to the axial direction 824 of the dielectric tube 806, thereby launching a transverse magnetic field surface wave (direction of the traveling electric field 816 is parallel to the wave propagation direction (surface wave 818)). The direction of the magnetic field is azimuthal while the direction of the electric field is axial or radial. The surface wave 818 propagates along the dielectric tube 806 and generates plasma along the way. The length of the column of plasma inside the dielectric tube 806 is a function of power and can be extended to any length based on the amount of input power. In some embodiments, at least one gas supply 840 may be connected to the dielectric tube 806, internally of the surfatron assembly 800 via at least one gas supply inlet 842. The gas provided by the gas supply 840 is used in some processes which provide process and/or reactive gases for radical delivery in a processing volume of a process chamber for substrate processing. The radical delivery is provided by holes typically in the bottom or the sides of the dielectric tube 806 (with similar parameters and orientations as holes 144 discussed above).

The inventors have found that the surfatron assembly 800 can operate in a frequency range of megahertz to gigahertz, from approximately 0.01 mTorr to atmospheric pressure. The low operating pressure capability of the surfatron assembly 800 was an unexpected advantage discovered by the inventors. The overall length 828 of the surfatron assembly 800 can be made less than 3 inches. In some embodiments, the length, height, and width are all less than 3 inches. In some embodiments, the overall length 828 can be less than approximately 2.5 inches with a height and width of less than 2 inches. In some embodiments, a first outer diameter 832 of approximately 1.0 inches of the dielectric tube 806 can be reduced to a second outer diameter 852 of approximately 0.5 inches externally of the surfatron assembly 800 in order to enter existing process chamber ports. In some embodiments, the inner diameter 830 of the dielectric tube 806 can be from approximately 0.2 inches to approximately 0.75 inches. In some embodiments, a thickness 834 of the dielectric tube 806 may be from approximately 0.0625 inches to approximately 0.125 inches. The thickness 834 may be adjusted to maintain integrity of the dielectric tube walls based on the amount of vacuum used during a substrate process. The walls of the dielectric tube 806 provide the vacuum boundary between the processing volume and the generated plasma inside of the dielectric tube 806. Process chambers with higher process vacuum may use a dielectric tube 806 with thicker walls. In some instances, an optional RF match 836 may be used between the surfatron assembly 800 and an RF generator 838. Depending on the size and/or design of the coaxial structure and the operational pressure regime, the optional RF match 836 may not be used in other instances, only the frequency tuning capability of the RF generator 838 is used.

Regardless of the configuration of the surfatron assembly (pass-through or non-pass-through), an ultraviolet (UV) filter may be required to prevent UV light from damaging the substrate being processed or causing other process issues. In some embodiments, a UV filter 904 is integrated into a surfatron assembly 902 either internally or externally as depicted in FIG. 9. The UV filter 904 is comprised of two separated UV blocking segments (a first or upper segment 912A and a second or lower segment 912B) that are opaque to UV light wavelengths. The two segments are spaced apart by a distance 916 of approximately 0.5 inches to approximately 2 inches. The spacing allows for minimal impedance for the gas flow 910 for gases flowing through or out of the surfatron assembly 902 into the dielectric tube 906 as depicted in view 900A. The UV blocking segments also have an overlap 914 of approximately 0.25 inches to approximately 2 inches to ensure that UV light does not enter the dielectric tube 906 as depicted in view 900B. The materials used for the UV blocking segments should be opaque to UV light wavelengths and maintain any particle or metal contamination requirement for a given process in a process chamber. The UV filter 904 may be made of materials opaque to UV light wavelengths such as silicon, ceramics, black quartz, and/or metal and the like.

Figure 10:
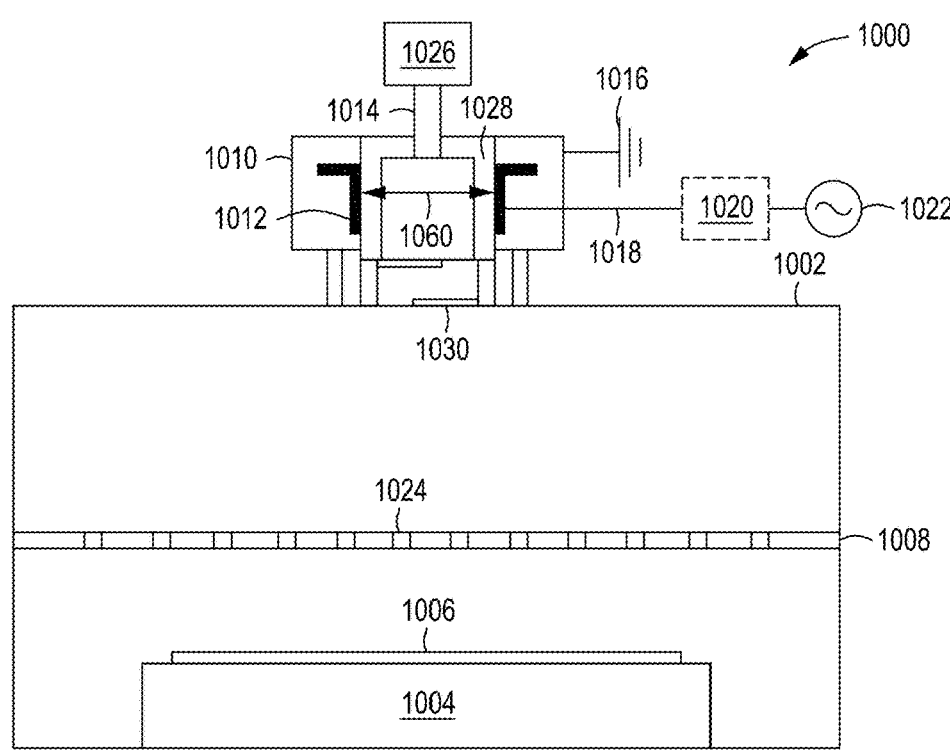
FIG. 10 depicts a cross-sectional view of a process chamber with a single top mounted plasma source in accordance with some embodiments of the present principles.

FIG. 10 is a cross-sectional view 1000 of a process chamber 1002 with a substrate support 1004 holding a substrate 1006. A gas distribution plate 1008 with distribution holes 1024 separates the substrate support 1004 and the substrate 1006 from the plasma source 1010 positioned on the top of the process chamber 1002. The gas distribution plate 1008 has a radially leveled flow conductance (e.g., by varying the number of holes radially) to distribute radicals to the substrate 1006. The plasma source 1010 has a dielectric tube 1028 with a portion that is surrounded by a conductive cylinder 1012 that is connected to an RF power supply 1022 via an RF electrode 1018 and optionally an RF match network 1020. The dielectric tube 1028 may be formed from quartz or ceramic materials with an outer diameter 1060 ranging from approximately 0.25 inches to approximately 20 inches. Thickness of the tube wall is determined based on diameter of the dielectric tube and/or operating pressure to maintain mechanical integrity. The plasma source 1010 may have a length of approximately 2.0 inches to approximately 20 inches. The plasma source 1010 may operate with a frequency of approximately 10 MHz to approximately 3 GHz with a power range of approximately 1 watt to approximately 5000 watts.

As noted above, the inventors have discovered that the operating pressure range of the plasma source 1010 may be as low as approximately 0.01 mTorr to as high as atmospheric conditions. At least one gas supply 1026 supplies gas into the dielectric tube 1028 via at least one gas supply inlet 1014. The plasma source 1010 is grounded via ground 1016. A UV filter 1030 blocks unwanted UV light from entering the process chamber 1002. The UV filter 1030 may be made of materials opaque to UV light wavelengths such as silicon, ceramics, black quartz, and/or metal and the like. In operation, the plasma source 1010 generates plasma via surface waves on the dielectric tube 1028 which projects into the process chamber 1002 and produces radicals for processing the substrate 1006 from the reactive gases supplied via the gas supply 1026. Distribution of the density of the radicals is substantially determined by the gas distribution plate 1008, placement of the surfatron over the substrate, and length of the column of plasma extending into the process chamber.

Figure 11:
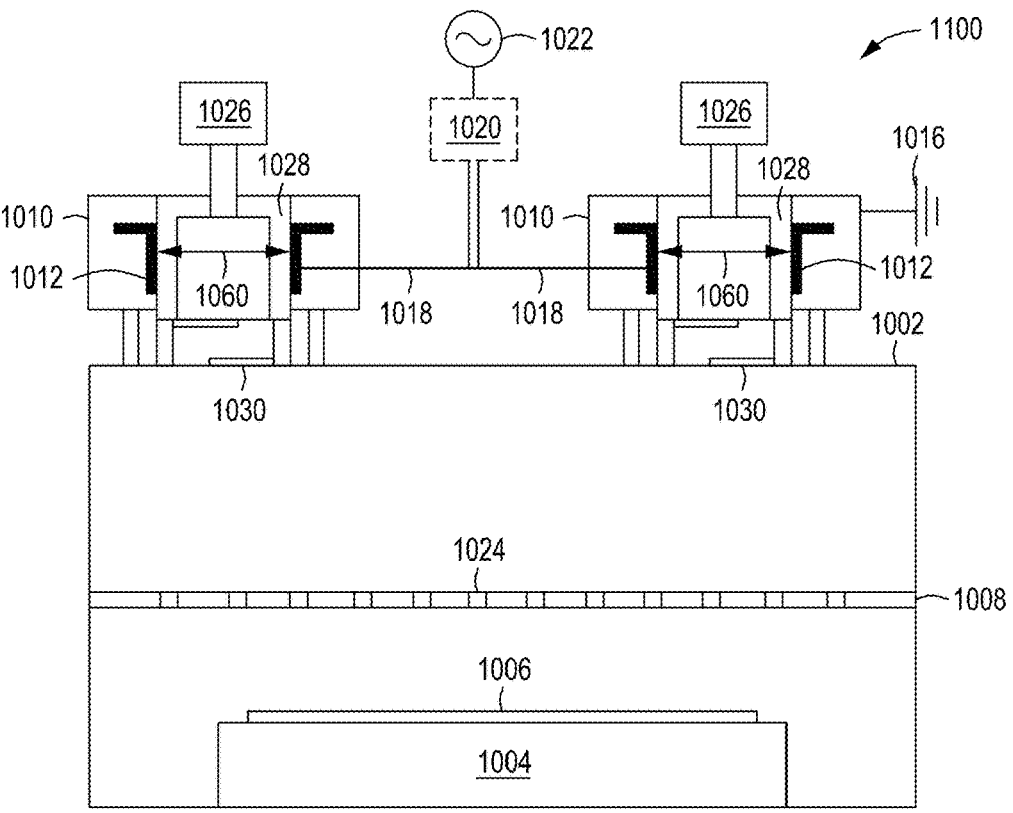
FIG. 11 depicts a cross-sectional view of a process chamber with dual top mounted plasma sources in accordance with some embodiments of the present principles.

FIG. 11 is a cross-sectional view 1100 of the process chamber 1002 with a plurality of plasma sources 1010 on the top of the process chamber 1002. Utilizing more than one plasma source 1010 facilitates in more evenly distributing the density of the radicals formed from the plasma. In the example, the plasma sources 1010 are both being fed by a common RF power supply 1022 via RF electrodes 1018. Each of the plasma sources 1010 can be fed RF power by different RF power supplies to further facilitate tuning of the radical densities within the process chamber 1002. Multiple RF power sources allows different frequencies and different power levels to be used in each of the plasma sources 1010.

Figure 12:
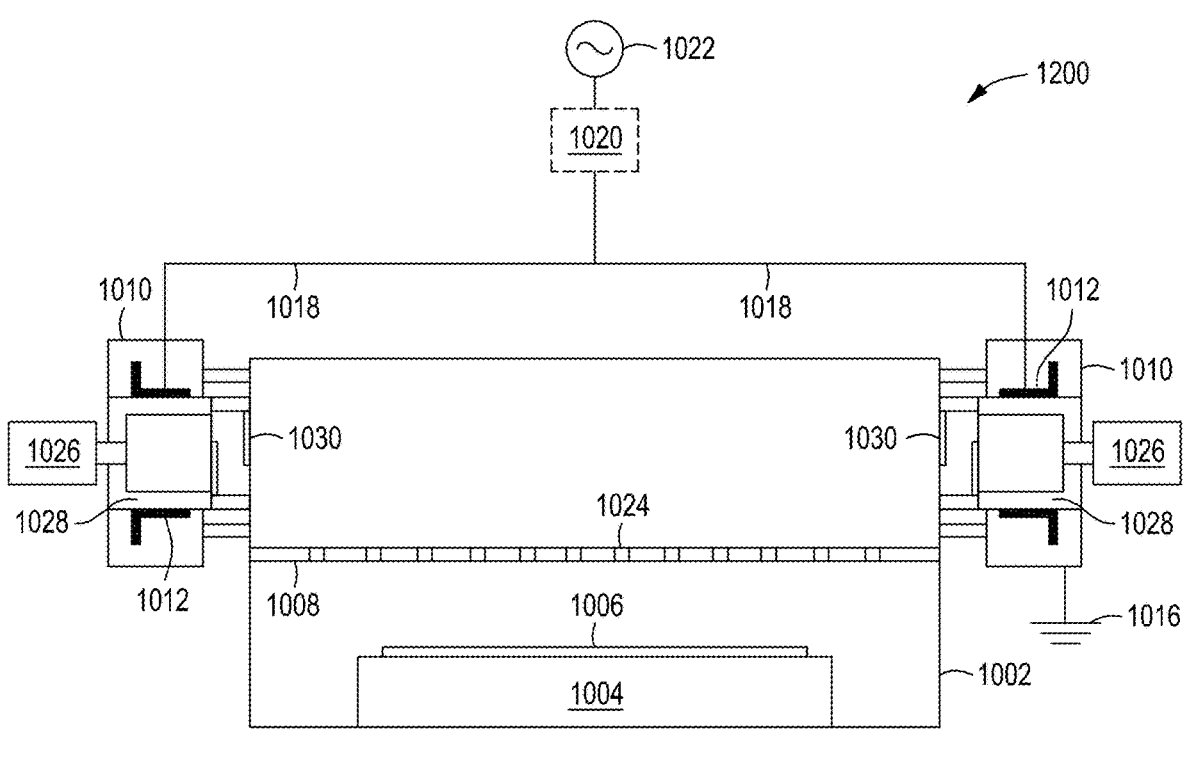
FIG. 12 depicts a cross-sectional view of a process chamber with dual side mounted plasma sources in accordance with some embodiments of the present principles.

FIG. 12 is a cross-sectional view 1200 of the process chamber 1002 with a plurality of plasma sources 1010 mounted horizontally and symmetrically on the process chamber 1002 in order to leave the top of the process chamber 1002 clear for other apparatus and/or existing apparatus. The configuration allows the plasma sources 1010 of the present principles to be more easily retrofit to existing process chambers. Utilizing more than one plasma source 1010 facilitates in more evenly distributing the density of the radicals formed from the plasma. In the example, the plasma sources 1010 are both being fed by a common RF power supply 1022 via RF electrodes 1018. Each of the plasma sources 1010 can be fed RF power by different RF power supplies to further facilitate tuning of the radical densities within the process chamber 1002. Multiple RF power sources allows different frequencies and different power levels to be used in each of the plasma sources 1010.

Figure 13:
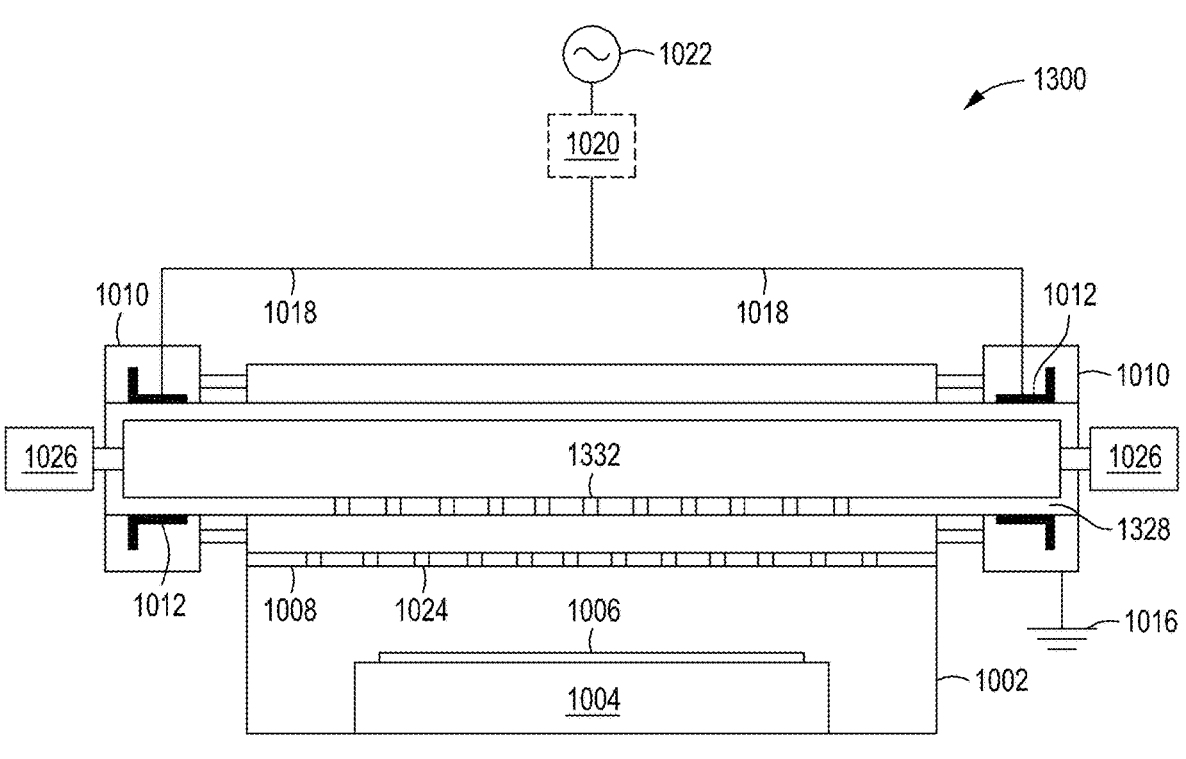
FIG. 13 depicts a cross-sectional view of a process chamber with dual side mounted plasma sources directly connected to a dielectric tube in accordance with some embodiments of the present principles.

FIG. 13 is a cross-sectional view 1300 of a process chamber 1002 with a substrate support 1004 holding a substrate 1006. A gas distribution plate 1008 with distribution holes 1024 separates the substrate support 1004 and the substrate 1006 from the plasma sources 1010 positioned on the sides of the process chamber 1002. In some embodiments, the gas distribution plate 1008 may have a radially leveled flow conductance (e.g., by varying the number of holes radially) to distribute radicals to the substrate 1006. The plasma sources 1010 are directly connected to a dielectric tube 1328 with a portion within each of the plasma sources that is surrounded by a conductive cylinder 1012 that is connected to an RF power supply 1022 via RF electrodes 1018 and optionally an RF match network 1020. The dielectric tube 1328 may be formed from quartz or ceramic materials. The plasma source 1010 may operate with a frequency of approximately 10 MHz to approximately 3 GHz with a power range of approximately 1 watt to approximately 5000 watts. As noted above, the inventors have discovered that the operating pressure range of the plasma source 1010 may be as low approximately 0.01 mTorr to as high as atmospheric conditions. Gas supplies 1026 supply gases into the dielectric tube 1328 via gas supply inlets 1014. The plasma sources 1010 are grounded via ground 1016. In operation, the plasma sources 1010 generate plasma via surface waves into the dielectric tube 1328 which extends into the process chamber 1002. Radicals are released via holes 1332 in the dielectric tube 1328 that are then distributed by the gas distribution plate 1008. In the configuration, the plasma is generated and maintained inside the dielectric tube 1328 which maximizes the radical output. Distribution of the density of the radicals is a combination of the holes 1332 in the dielectric tube 1328 and the gas distribution plate 1008.

Figure 14:
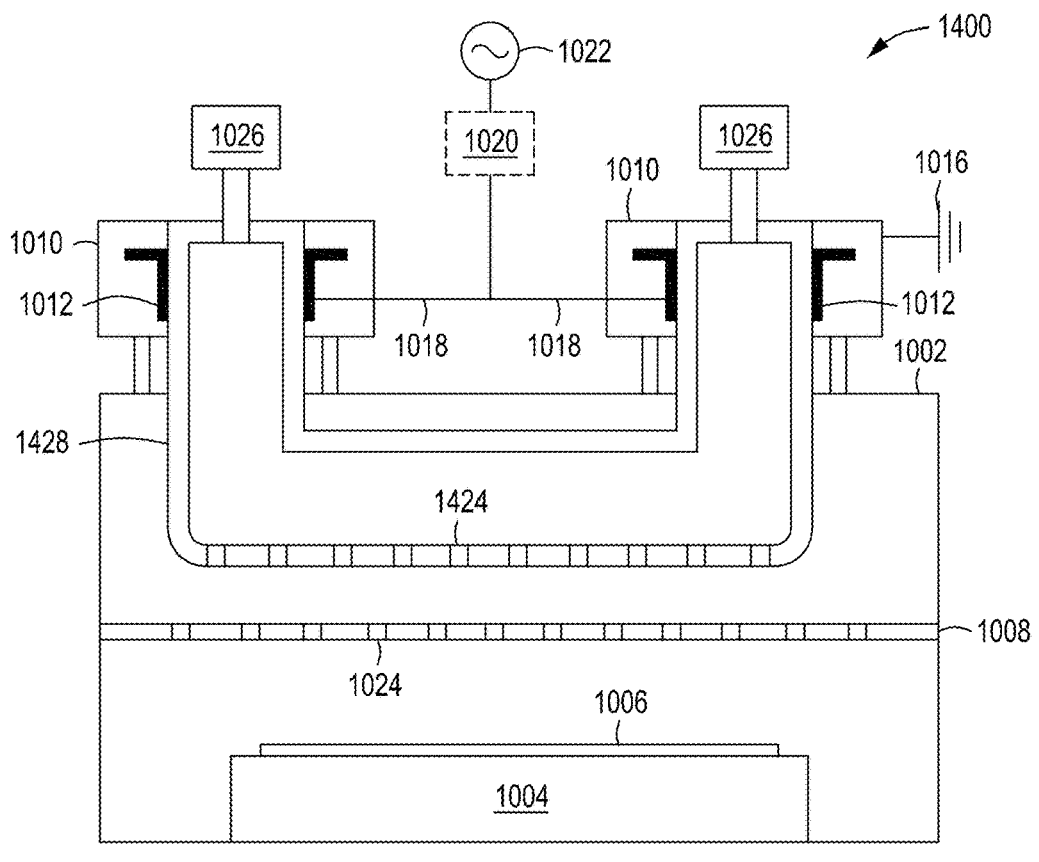
FIG. 14 depicts a cross-sectional view of a process chamber with dual top mounted plasma sources directly connected to a dielectric tube in accordance with some embodiments of the present principles.

FIG. 14 is a cross-sectional view 1400 of a process chamber 1002 with a substrate support 1004 holding a substrate 1006. A gas distribution plate 1008 with distribution holes 1024 separates the substrate support 1004 and the substrate 1006 from the plasma sources 1010 positioned on the top of the process chamber 1002. In some embodiments, the gas distribution plate 1008 may have a radially leveled flow conductance (e.g., by varying the number of holes radially) to distribute radicals to the substrate 1006. The plasma sources 1010 are directly connected to a dielectric tube 1428 with a portion within each of the plasma sources that is surrounded by a conductive cylinder 1012 that is connected to an RF power supply 1022 via RF electrodes 1018 and optionally an RF match network 1020. The dielectric tube 1328 may be formed from quartz or ceramic materials. The plasma source 1010 may operate with a frequency of approximately 10 MHz to approximately 3 GHz with a power range of approximately 1 watt to approximately 5000 watts. As noted above, the inventors have discovered that the operating pressure range of the plasma source 1010 may be as low as approximately 0.01 mTorr to as high as atmospheric conditions. Gas supplies 1026 supply gases into the dielectric tube 1428 via gas supply inlets 1014. The plasma sources 1010 are grounded via ground 1016.

Figure 15:
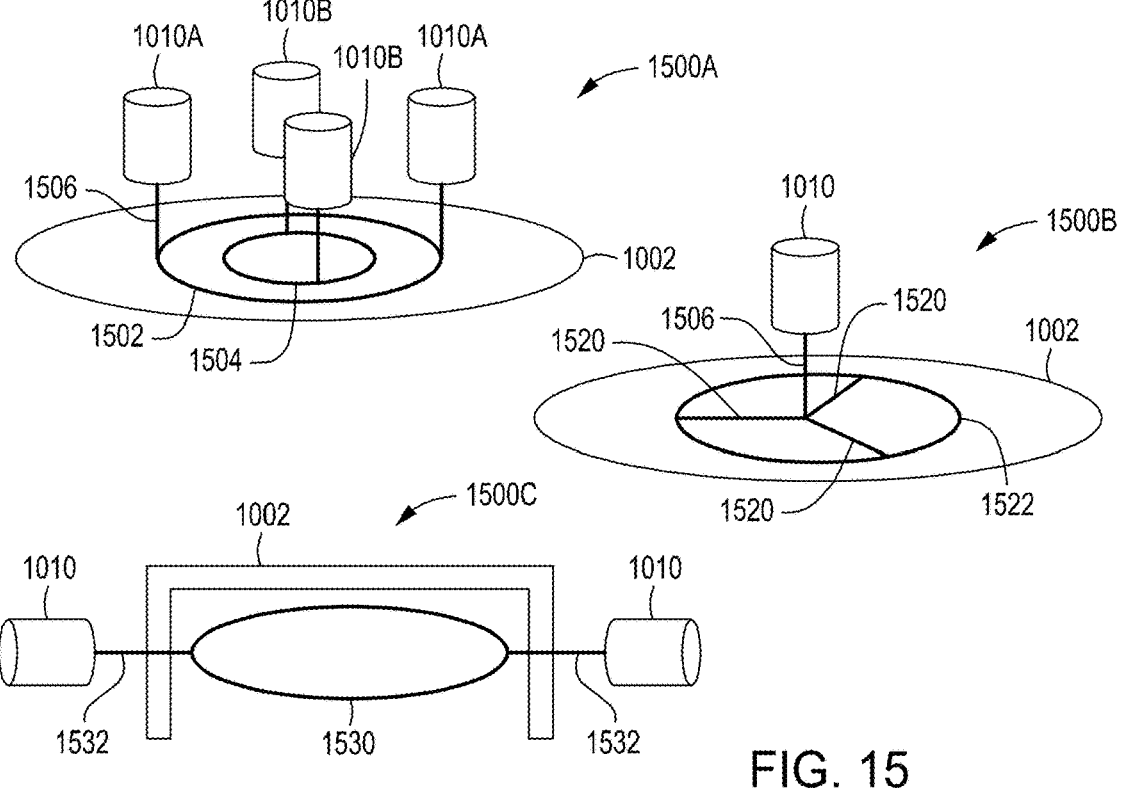
FIG. 15 depicts isometric views of alternative dielectric tube configurations in accordance with some embodiments of the present principles.

In operation, the plasma sources 1010 generate plasma via surface waves into the dielectric tube 1428 which extends into the process chamber 1002. Radicals are released via holes 1424 in the dielectric tube 1428 that are then distributed by the gas distribution plate 1008. In the configuration, the plasma is generated and maintained inside the dielectric tube 1428 which maximizes the radical output. Distribution of the density of the radicals is a combination of the holes 1424 in the dielectric tube 1428 and the gas distribution plate 1008. The shape of the dielectric tube that extends into the process chamber 1002 may be altered to better distribute radicals within the process chamber 1002 for a given process or a given chamber type as depicted in FIG. 15. In a view 1500A, multiple plasma sources 1010 are positioned above the process chamber 1002. One pair of plasma sources 1010A is directly connected to an outer circular dielectric tube 1502 via vertical dielectric tube sections 1506 and another pair of plasma sources 1010B are connected to an inner circular dielectric tube 1504. The two 'rings' can provide better radial uniformity during substrate processing. In a view 1500B, a single plasma source 1010 is directly connected via a vertical dielectric tube section 1506 to radial dielectric tube sections 1520 to a circular dielectric tube section 1522. In a view 1500C, a pair of plasma sources 1010 are directly connected via horizontal dielectric tube sections 1532 to a circular dielectric tube section 1530. Each of the dielectric tube and plasma source configurations can be used to provide enhanced distribution characteristics of radicals to a substrate process.

Figure 16:
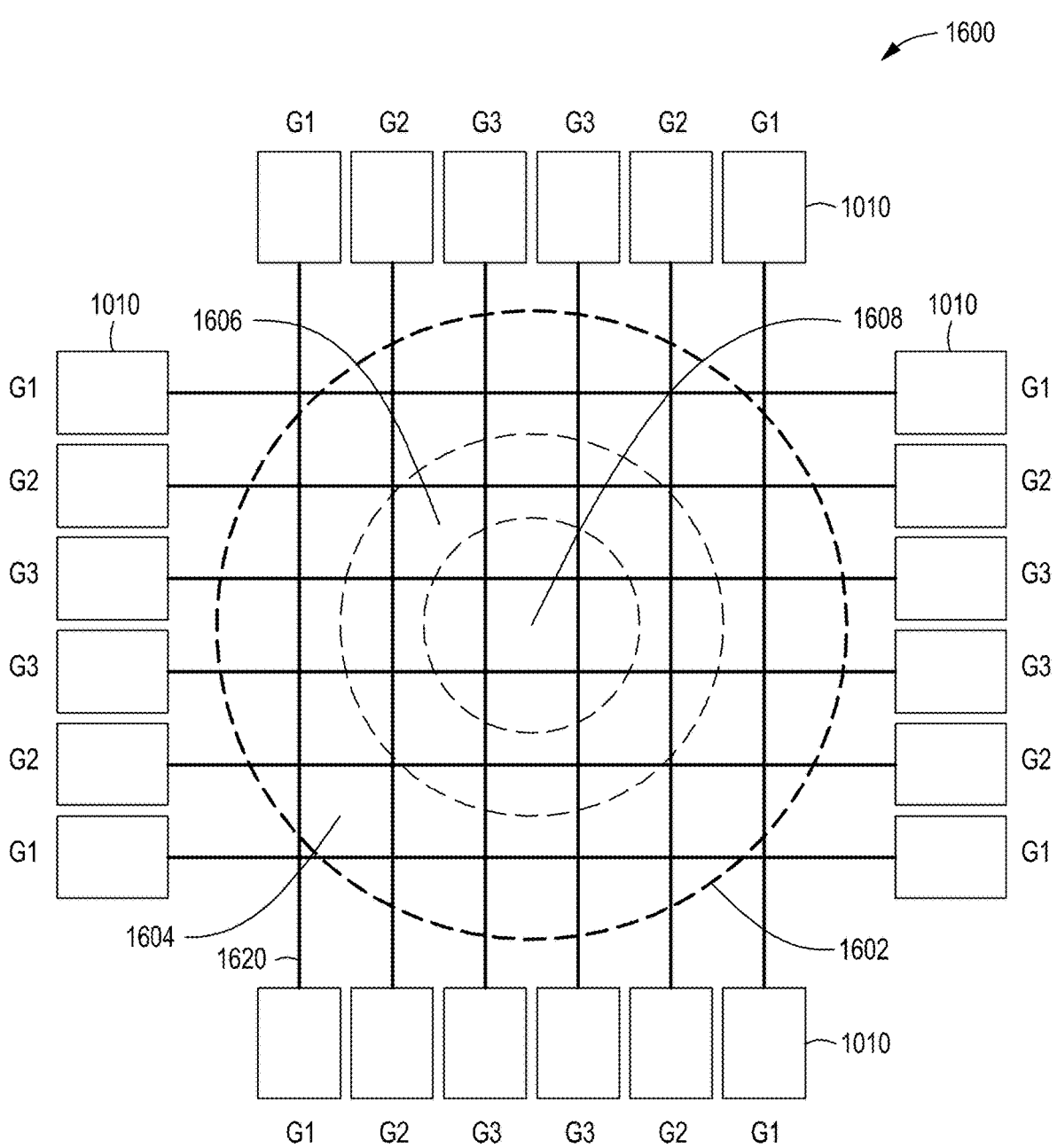
FIG. 16 depicts a top-down view of a dielectric tube grid configuration powered by multiple RF generators in accordance with some embodiments of the present principles.

In a top-down view 1600 of FIG. 16, a grid configuration of plasma sources 1010 and dielectric tubes provides pixelated radical delivery to a substrate during processing. Each row or column of dielectric tubes 1620 can be separately powered by one or two plasma sources 1010. To reduce the number of RF generators, the plasma sources 1010 can be grouped to control the radial density at an outer region 1604 of the substrate 1602 (e.g., "G1" plasma sources 1010 are powered by a first RF power source), at a middle region 1606 of the substrate 1602 (e.g., "G2" plasma sources 1010 are powered by a second RF power source), and at a center region 1608 of the substrate 1602 (e.g., "G3" plasma sources 1010 are powered by a third RF power source). All configurations of the apparatus of the present principles provide a highly efficient downstream plasma source with miniature size which can be easily integrated into any existing process chamber.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus, comprising:
a chamber with a bottom, a lid, and walls that provide a processing volume above a substrate support; and
a plurality of plasma sources directly interconnected via a dielectric tube and each encompassing a portion of the dielectric tube with a conductive tube, wherein the dielectric tube has ends that are connected together and the dielectric tube extends at least partially extends into the processing volume, and wherein the plurality of plasma sources is configured to generate surface waves in walls of the dielectric tube by energizing the conductive tube that support plasma generation within the dielectric tube, and wherein the dielectric tube is configured to act as a vacuum boundary between plasma formed within the dielectric tube by the surface waves and the processing volume.

2. The apparatus of claim 1, wherein the plurality of plasma sources is positioned within the walls of the chamber and partitioned from the processing volume.

3. The apparatus of claim 1, wherein one or more of the plurality of plasma sources has one or more gas inlets configured to provide process gas or reactive gas inside of the dielectric tube.

4. The apparatus of claim 3, wherein at least one of the one or more gas inlets is located at an opposite end of the one or more of the plurality of plasma sources to an end of which the dielectric tube extends from.

5. The apparatus of claim 1, wherein the dielectric tube has one or more gas inlets configured to provide process gas or reactive gas inside of the dielectric tube.

6. The apparatus of claim 1, wherein the dielectric tube has a plurality of holes or nozzles directed at the substrate support and wherein the plurality of holes or nozzles is configured to release radicals from within the dielectric tube towards the substrate support.

7. The apparatus of claim 1, wherein the dielectric tube has an overall circular shape that mimics an outer perimeter of the processing volume.

8. The apparatus of claim 1, wherein the dielectric tube has concentric circular portions and radial extensions that connect the concentric circular portions.

9. The apparatus of claim 1, wherein the dielectric tube has an outer diameter of less than approximately 0.5 inches and inner diameter of less than approximately 0.3 inches.

10. The apparatus of claim 1, wherein the chamber is an etch chamber or a deposition chamber.

11. The apparatus of claim 1, wherein at least one of the plurality of plasma sources is a surfatron with a length and width of less than three inches.

12. The apparatus of claim 1, wherein the plurality of plasma sources is positioned externally around the walls of the chamber.

13. The apparatus of claim 1, wherein the plurality of plasma sources is positioned above and external to the lid of the chamber.

14. The apparatus of claim 1, wherein each of the plurality of plasma sources is connected to at least one RF power source which provides RF power directly to the respective conductive tube surrounding the portion of the dielectric tube.

15. An apparatus that provides plasma to a chamber, comprising:
a plurality of plasma sources, each with a conductive tube and a gas inlet, wherein the respective conductive tube surrounds a portion of a dielectric tube and the respective conductive tube configured to be directly connected to RF power to generate surface waves in walls of the dielectric tube which form plasma within the dielectric tube, and wherein the gas inlet is connected to the dielectric tube near one end of the conductive tube; and
the dielectric tube directly connected through each of the plurality of plasma sources and is configured to act as a vacuum boundary between plasma generated within the dielectric tube and a processing volume of the chamber to contain plasma generated by the plurality of plasma sources and is configured to release radicals generated in the plasma via holes or nozzles in the dielectric tube and wherein the holes or nozzles in the dielectric tube are positioned in a portion of the dielectric tube which is configured to be inserted into the chamber.

16. The apparatus of claim 15, wherein the dielectric tube has an overall circular shape that mimics an outer perimeter of an inner volume of the chamber.

17. The apparatus of claim 15, wherein the dielectric tube has concentric circular portions and radial extensions that connect the concentric circular portions.

18. The apparatus of claim 15, wherein the dielectric tube has an outer diameter of less than approximately 0.5 inches and inner diameter of less than approximately 0.3 inches.

19. The apparatus of claim 15, wherein at least one of the plurality of plasma sources is a surfatron with a length and width of less than three inches.

20. An apparatus, comprising:
a chamber with a bottom, a lid, and walls that provide a processing volume above a substrate support;
a plurality of plasma sources with inlets and outlets for a dielectric tube to pass through, wherein the plurality of plasma sources is positioned within the walls of the chamber and partitioned from direct exposure to the processing volume, and wherein each of the plurality of plasma sources is a surfatron with a length, width, and height of less than three inches, wherein each plasma source has a conductive tube which surrounds a portion of the dielectric tube; and the dielectric tube directly connected to each of the plurality of plasma sources, wherein the dielectric tube at least partially extends into the processing volume wherein the dielectric tube has one or more gas inlets for a gas that forms plasma within the dielectric tube, and wherein the dielectric tube is configured to act as a vacuum boundary between plasma generated within the dielectric tube and the processing volume.

* * * * *